United States Patent [19]

Kelly et al.

[11] Patent Number: 4,672,615
[45] Date of Patent: Jun. 9, 1987

[54] ION AND ELECTRON BEAM STEERING AND FOCUSSING SYSTEM

[75] Inventors: John C. Kelly, Turramurra; Glenn W. Kentwell, Waverley, both of Australia

[73] Assignee: Unisearch Limited, Kensington, Australia

[21] Appl. No.: 515,242

[22] Filed: Jul. 19, 1983

[30] Foreign Application Priority Data

Jul. 20, 1982 [AU] Australia ................................ PF4955

[51] Int. Cl.$^4$ ............................................... H01S 3/00
[52] U.S. Cl. ........................................ 372/2; 372/101;
372/37; 315/3; 315/4; 315/5.41; 328/233
[58] Field of Search ....................... 372/101, 37, 2, 73,
372/74; 315/3, 4, 5; 328/233

[56] References Cited

U.S. PATENT DOCUMENTS 4,392,078  7/1983  Noble et al. .............................. 315/4
4,466,101  8/1984  Schoen .................................... 372/2

OTHER PUBLICATIONS

J. C. Kelly; "Axially Symmetric Electrostatic and Magnetic Fields for Ion Beam Focusing"; *IEEE Trans. on Nuc. Sci.*, V. NS-30, No. 2, Apr. 1983, pp. 1476-1479.

"A New Magnetic Coaxial Lens System for Hollow Ion Beams", G. W. Kentwell and J. C. Kelly, 1983, pp. 1-4.
"Facilities in the United States", Ednor M. Rowe, Physics Today, May 1981, pp. 28-37.
"Optical Properties of Cylindrical Lenses", Vsevolozhshaya et al., Sov. Phys. Tech. Phys., vol. 20, No. 12, pp. 1556-1563.
White; Modern College Physics, (Sixth Edition), pp. 408-409, 1972.

Primary Examiner—Léon Scott, Jr.
Attorney, Agent, or Firm—Millen & White

[57] ABSTRACT

An ion or electron beam is steered or focussed by a circular magnetic field produced by passing a large electrical current through a straight conducting wire, the magnetic field being co-axial with the wire. Annular beams of charged particles coaxial with the straight wire can be focussed onto a circular spot or, depending upon the entry radius of the annular beam and the magnetic field strength, can be induced to follow a looping trajectory. The effect of the steering or focussing system can be enhanced by the provision of a cylindrical conductor which is co-axial with the straight conducting wire such that the particle beam passes between the wire and the cylindrical conductor. The beam steering or focussing systems is applicable to the fields of beam current density intensification, ion implantation, ion separation and free electron lasers.

25 Claims, 14 Drawing Figures

ION AND ELECTRON BEAM STEERING AND FOCUSSING SYSTEM

BACKGROUND OF THE INVENTION

The present invention relates to a method of, and apparatus for, focussing and steering charged particle beams (e.g. beams of ions or beams of electrons) and for shaping such beams into a range of desired configurations.

Generally, the devices of the prior art currently in use to focus electrons, that is, to cause electrons to converge toward a common point or focus, all employ a cathode for emitting electrons and an anode to which is applied a voltage for accelerating the electrons from the cathode to the anode and use either or both magnetic or electrostatic fields disposed between the anode and the cathode to deflect the electrons and cause them to converge to a common point, for example, the devices used to focus electrons in a cathode ray tube or electron microscope. However, such devices are limited in their ability to reach the high beam currents that are required in high energy physics devices.

In the field of synchrotron radiation the devices employed in the prior art, e.g., synchrotrons are enormously expensive and hence their use is restricted.

SUMMARY OF THE INVENTION

According to the invention, means are provided which can operate with a wide range of beam energies (e.g. thousands of electron volts to billions of electron volts) and a wide range of beam currents and can be used to produce synchrotron radiation for a modest capital outlay.

Embodiments of the present invention provide an ion and electron beam steering and focussing system, wherein a magnetic field is used to focus a beam of such particles.

The present invention consists of an ion or electron beam steering or focussing system comprising a straight conducting wire adapted to carry a large electric current, which current produces a circular magnetic field about said conducting wire and co-axial therewith, whereby a charged particle forming part of a beam of charged particles travelling through said magnetic field is deflected with respect to the conducting wire by a force exerted on said particle as a result of its motion through said field.

In one application the present invention can be used to provide a simple mass spectrometer for separating particles of different masses, or for separating different isotopes, or for separating particles of different charge state.

Such a beam of mixed particles, say a beam of particles of mixed or different charge state, will be focussed at different foci, and the focus point may also be varied by varying the current. As particles travelling closest to the conductor are much more strongly deflected than are particles at a greater distance from the conductor, the best effect is achieved with annular beams.

In another application of the present invention a beam current density intensifier is produced which makes use of the ion and electron beam steering and focussing system to focus a hollow annular beam coaxial with said straight conducting wire onto a small spot or target.

In yet another application of the present invention a synchrotron radiation generator makes use of the ion and electron beam steering and focussing system to steer a hollow annular beam which is co-axial with the straight conducting wire into paths having a short radius of curvature whereby synchrotron radiation is emitted. In an extension to this application the synchrotron radiation generator can be used to produce a free electron laser capable of producing radiation in the x-ray band.

In a further application of the present invention the beam steering and focussing system can be used to produce high current ion beams for use in ion implantation equipment. Such implantation equipment is used for the surface implantation of substances such as metals and the implantation of semiconductor devices. An example of the surface implantation of metals is the implantation of high tensile steel with cromium and nickel ions to produce a stainless steel surface layer without seriously affecting the strength of the high tensile steel.

BRIEF DESCRIPTION OF THE DRAWINGS

Embodiments of the invention will now be described by way of example with reference to the accompanying drawings in which.

DETAILED DISCUSSION OF THE INVENTION

Figure 1:
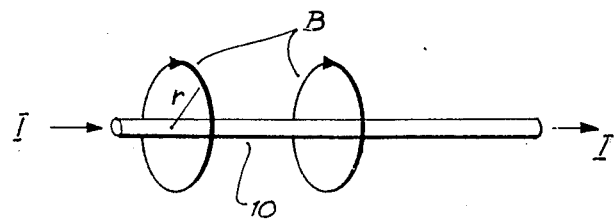
FIG. 1 schematically illustrates a straight conducting rod, surrounded by a co-axial circular magnetic field produced by the current flowing through the rod.
Figure 2:
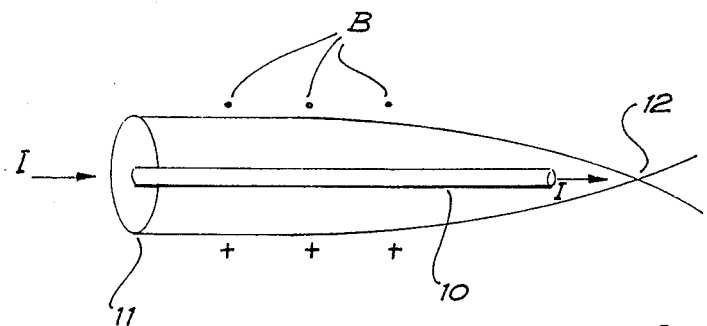
FIG. 2 schematically illustrates the focussing effect of a circular magnetic field on a hollow annular beam of electrons.

Referring to FIG. 1, the magnetic field about a straight conductor 10 carrying a current I is a circular field, the strength B of which varies inversely as the distance r from the axis of the wire 10 and acts to focus particles travelling nearly parallel to the wire. Particles initially moving parallel to the wire and at the same distance from it are brought to focus at the same point. A hollow annular beam 11 of particles is focussed down to a circular spot 12 (see FIG. 2) producing a manyfold increase in the available current density from a charged particle beam. Such a power density increase is valuable in producing fusion reactions by ion beam compression of tritium and deuterium. A further advantage of the hollow beam configuration is that for most of its travel the particles are much further apart than in a solid beam and hence space charge beam spreading is minimized. By adjusting the current in different sections of the rod, or by combining a series of such elements, aberrations—which occur in any such lens device—may be minimized and particles with a wide range of input radii can be successfully brought to a focus.

Figure 3:
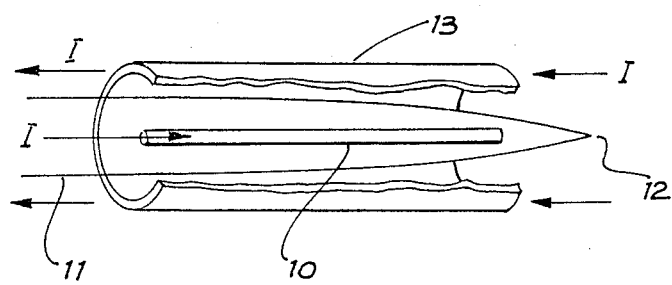
FIG. 3 schematically illustrates a lens of the present invention, whereby the current passing through the rod is returned via a coaxial outer tube.
Figure 4:
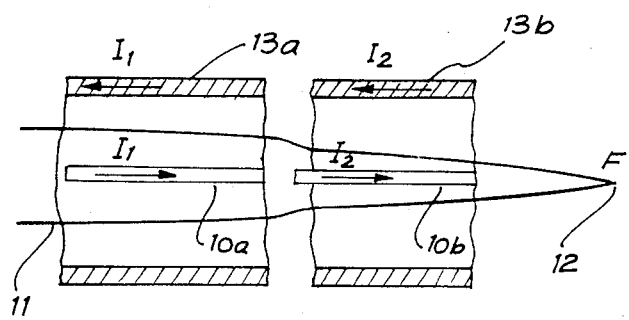
FIG. 4 schematically illustrates a duel lens system wherein each lens is similar to the lens of FIG. 3.

The external magnetic field can be minimized by returning the current along a coaxial tube 13 of suitable diameter, as indicated in FIGS. 3 and 4. The outer tube 13 is in no way essential for the working of the device but has the advantage of shielding external equipment from the magnetic field of the device.

By use of a number of different current carrying rods, configurations other than those with circular symmetry can be achieved. In the simplest case the rods would be parallel, but more complex configurations could be used.

For the steering and focussing of very energetic beams, very large currents through a central rod of small diameter is required. This can be best achieved by using a superconductor for the central rod or for both elements in the coaxial system.

Figure 5:
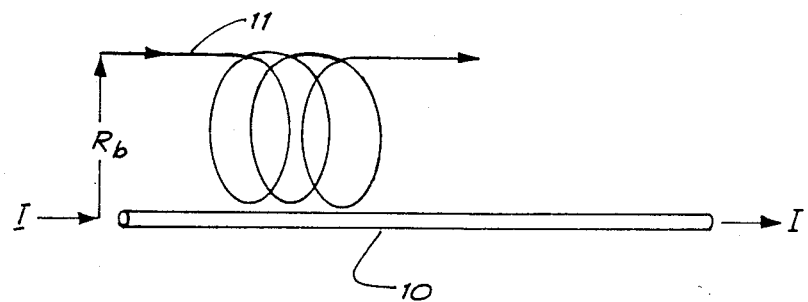
FIG. 5 schematically illustrates a looping trajectory which can be achieved with selected electron beam entrance radii and magnetic field strengths.

Referring to FIG. 5, for the correct selection of beam entry radius $R_b$ and conductor current I, the beam 11 can be made to follow a looping path. This effect is used in several applications of the present invention.

In a practical beam intensifying device the rod would terminate before the beam strikes it and the particles converge to a focus beyond the exit end of the focussing device.

The radial magnetic field at a distance r from a straight conductor carrying a current I is given by:

$$B = (\mu_0 I / 2\pi r) \quad (1)$$

This l/r field offers the possibility of making a simple strong focussing high current lens for charged particles. Some of the properties of the present co-axial (ICOL) focussing device will now be compared with the earlier ELCO (Electrostatic co-axial) lens system.

The ELCO lens uses a l/r electric field generated by applying an electric potential difference between the co-axial conductors with a hollow annular beam travelling between them. Being electrostatic the ELCO focussing behaviour is mass independent which is useful as an ion probe using a variety of ions at moderate energy. The disadvantage with this system is that the distance between the inner and outer conductors must increase if we apply higher voltages required for better focussing, to avoid sparking. As a result, however, the strength of the l/r field is not sufficient, except at distances close to the inner conductor, to focus high energy particles. This results in a small deflection of the ion trajectory. The ICOL offers stronger focussing in the high energy range, even for comparitively large radial distances from the high current carrying wire. If a superconducting focussing wire is used a very large current is possible and even stronger focussing will occur. For example, GeV protons and electrons can be focussed in less than two meters with an entrance radius up to 100 mm from the wire center.

The ICOL may be useful in overcoming the present difficulty in focussing heavy current ion beams used in ion induced fusion experiments. It may also be used to mass separate particle beams over a wide range of energies. The system may be used as a source of synchroton radiation since for high enough current through the focussing wire the radius of curvature of the particles path as it approaches the wire is very small.

Figure 6:
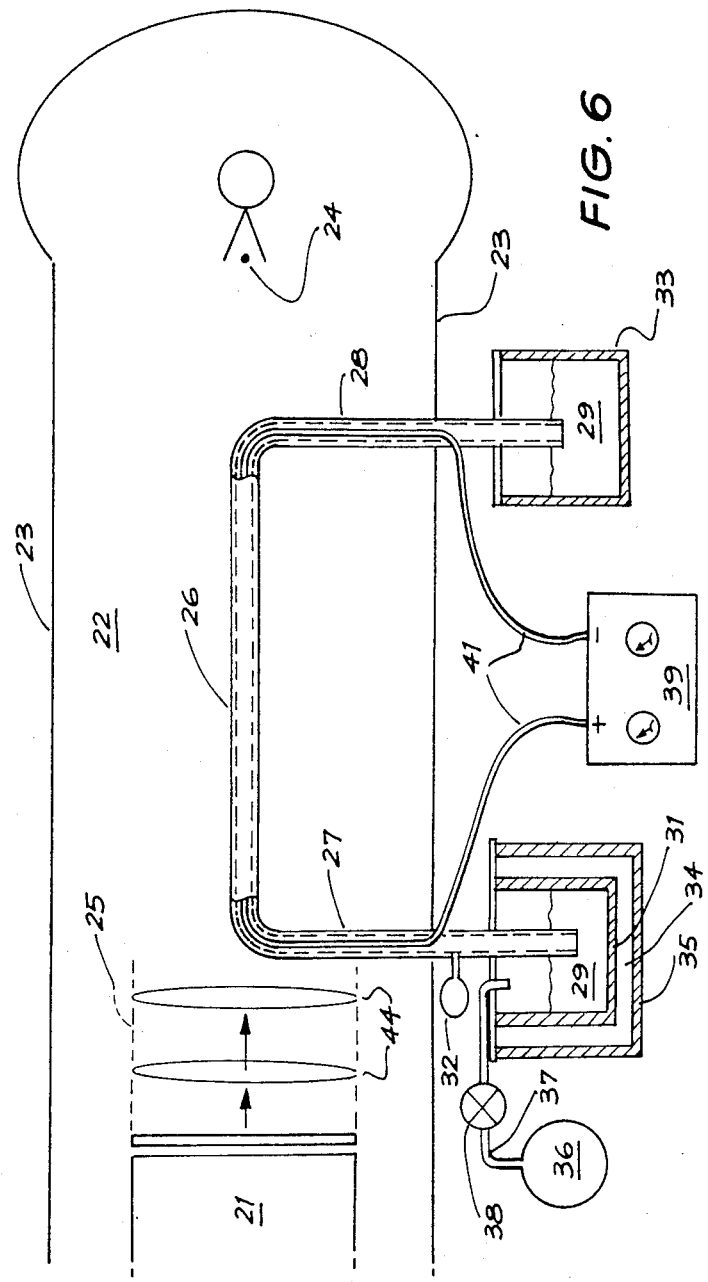
FIG. 6 schematically illustrates a first embodiment of a beam focussing system according to the present invention.

An embodiment of a beam current density intensifier of the present invention will now be described, with reference to FIG. 6, which illustrates a source of electrons 21 which is disposed at one end of a vacuum chamber 22 contained by an envelope 23. The source 21 produces a circular electron beam 25, the axis of which is directed towards a target 24. A hollow superconducting wire 26 is disposed between the source 21 and the target 24 and co-axial with the circular electron beam.

Liquid helium ($He_3$) is delivered to the center of the superconducting wire 26 via a delivery tube 27 and is removed from the super conducting wire via an exit tube 28. The delivery tube carries liquid helium 29 from a source chamber 31 to the input end of the superconducting wire 26, and helium pressure is monitored by a pressure gauge 32, and the exit tube 28 carries the liquid helium 29 from the output end of the semiconducting wire to the receiving chamber 33. The source chamber 31 is surrounded by a vacuum space 34 within an outer envelope 35. A source 36 of gas under pressure such as hydrogen is connected by a tube 37 to the source chamber 31 via a valve 38 to provide a slight increase in pressure in the space above the helium 29 in the source chamber. This slight pressure increas causes helium to move through the delivery tube 27, the superconducting wire 26 and the exit tube 28 into the receiving chamber 33.

A high-current power supply 39 provides a source of current to the superconducting wire 26 via high current leads 41. In order to prevent the conduction of heat into the superconducting wire 26 via the high current leads 41 they can be run through the liquid helium tubes 27 and 28. This arrangement also reduces the number of ports required in the envelope 23 of the vacuum chamber 22.

Figure 7:
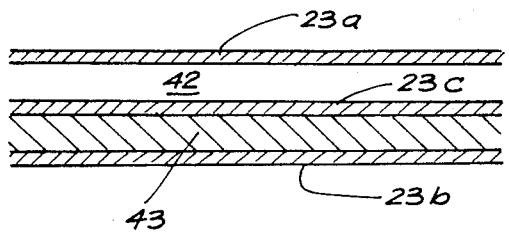
FIG. 7 illustrates in detail the structure of the outer envelope of the vacuum chamber of FIG. 6.

The structure of the envelope 23 may be viewed more radaily in FIG. 7, wherein it will be seen that the envelope 23 comprises an outer wall 23a, an inner wall 23b and an intermediate wall 23c. The outer wall 23a and the intermediate wall 23c are separated by a vacuum space 42 and the inner wall 23b and the intermediate wall 23c are separated by a nitrogen jacket 43. As a vacuum of $10^{-7}$ Torr will still enable heat conduction, the nitrogen jacket 43 reduces the heat flow through the envelope 23 of the vacuum chamber 22.

To bring the superconducting wire down to operating temperature, liquid nitrogen ($N_2$) is first introduced to the helium source chamber 31, and used to reduce the temperature to 70° K. The system is then flushed with gaseous nitrogen or hydrogen, and the liquid helium introduced for the final stage of cooling. Once the operating temperature has been achieved a close watch must be maintained on the helium pressure in the system to ensure that the helium is not evaporating.

With the superconductor at operating temperature the current through the superconductor may be slowly increased to the desired value, while voltage and helium pressure are monitored to ensure neither is increasing. Once the desired current has been established in the superconducting wire, electron beams 25 may be generated from the source 21. The beam 105 is generated with a gap 44 corresponding to the part of the beam which would otherwise pass through the current leads 41. The beam 25 is focused by the concentric magnetic field produced about the superconducting wire 26 and thus caused to strike the target 24 causing an interaction of the focused beam with the target.

The present invention also provides the basis for a supplementary focussing system to be used in conjunction with existing accelerators. Heavy ions (e.g., for nuclear physics and ion implantation for making semiconductor devices), with energies of the order of 1 million volts, are very difficult to deflect. By use of the device of the present invention it is possible to focus such heavy ions within one quarter of the distance of that possible with conventional devices on accelerators.

The focussing of charged particles also depends on their mass and hence apparatus of the present invention will also function as a simple mass spectrometer and as an isotope separator because of the $V \times B$ forces acting on the beam. Thus if a beam of charged particles comprises two different types of particles, each of different mass (e.g. H and Li), they would focus at different foci, particles of lower mass being deflected to a greater extent to be focussed at a point closer to the source.

The apparatus of the present invention will also separate particles of different charge state e.g., $C^+$, $C^{++}$, $C^{6+}$. The particles with the biggest charge will experience the strongest force.

For a suitable choice of entrance radius and lens current the trajectories become a series of identical loops which do not strike the wire. This grad $B \times B$ drift, as it is known in other fields, in the case of the present invention produces a path with a very small radius of curvature for high energies, see FIG. 5.

Prior art isotope separators are very expensive pieces of equipment and, therefore, the practice of using particular beneficial isotopes in fields such as medicine is restricted due to the high cost of obtaining these isotopes. The present invention can be used to provide a simple isotope separator which is capable of producing isotopes for medical use more cheaply than previously used methods. This separator can also be used in the field of carbondating.

Figure 8:
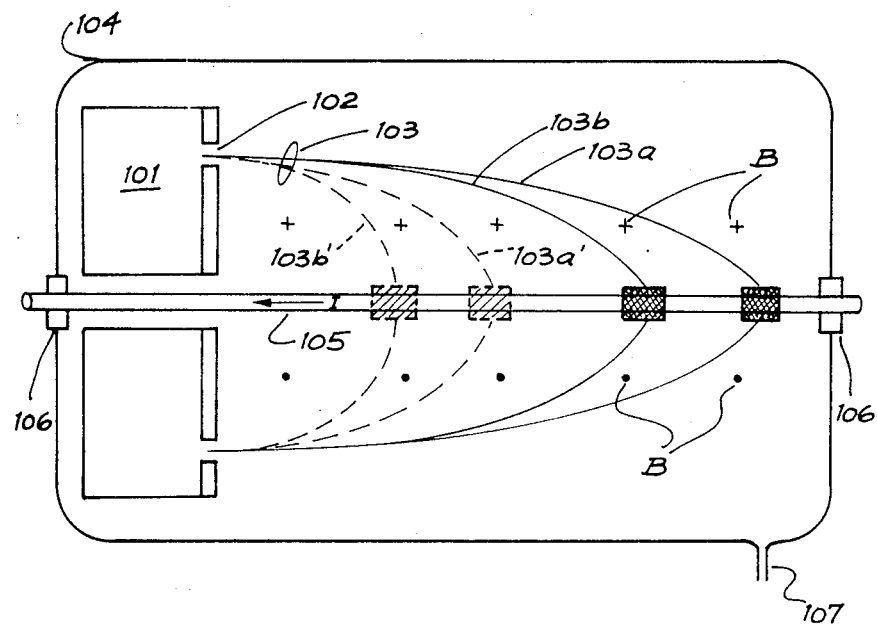
FIG. 8 schematically illustrates a second embodiment of a beam focussing system according to the present invention, which is adopted for use as an ion separator.

Referring to FIG. 8, an isotope separator relying upon the principles of the present invention comprises an ion beam source 101 having an annular opening 102 through which an annular ion beam 103 is projected, the ion beam comprising both wanted and unwanted isotopes. The ion beam source is also annular in shape and is contained at one end of an evacuated envelope which is not shown in detail but which can be similar in general construction to the envelope of FIGS. 6 and 7, or of any other suitable form of construction. A straight conductor 105 enters the envelope at one end, passes through the centre of the ion beam source and extends the length of the envelope 104 before exiting at the other end thereof. Seals 106 are provided at the points where the conductor enters and exits the envelope to minimize leakage of air into the envelope which is evacuated via a port 107 connected to a vacuum pump. In another embodiment, a co-axial cylindrical outer conductor may also be provided, as described with reference to FIGS. 3 and 4. In order to achieve high currents in the straight conductor, a super conductor may be employed, or alternatively, the operation may be pulsed.

Passing the straight conducting wire 105 through the ends of the envelope 104 has advantages in that no supply wires pass through the beam 103 thereby avoiding unwanted fields which could interfere with the beam steering system, and in that it is not necessary to take precautions to prevent beam particles striking the supply wires.

In operation, a large current I is passed along the conductor 105 to generate a strong co-axial magnetic field B, and the annular ion beam 103 is deflected towards the straight conductor 105. It will be recognised by a person skilled in the art that FIG. 8 represents an arrangement for separating positively charged ions wherein the direction of current flow is opposite to that shown in FIGS. 1-5. The separation of negatively charged ions will require the direction of current flow to be as shown in FIGS. 1-5. Different isotopes within the beam 103 will follow different trajectories 103a and 103b to be deposited upon different portions of the conductor 105, while isotopes having different charge states will follow still different trajectories 103a' and 103b'. After a period of time, the conductor can be removed from the apparatus and the various isotopes removed from their respective positions along the wire.

With elements of higher atomic weights, the degree of separation attained using the equipment of FIG. 8 will not be sufficient to achieve axially separated deposits along the straight conductor 105, in which case the technique now described with reference to FIG. 9 can be employed. As previously stated, for a suitable choice of entrance radius and lens current the trajectories of beam particles become a series of identical loops which do not stike the wire. This property may be used to advantage to enhance the separation of two isotpes which would not be separated sufficiently by the apparatus of FIG. 8.

Figure 9:
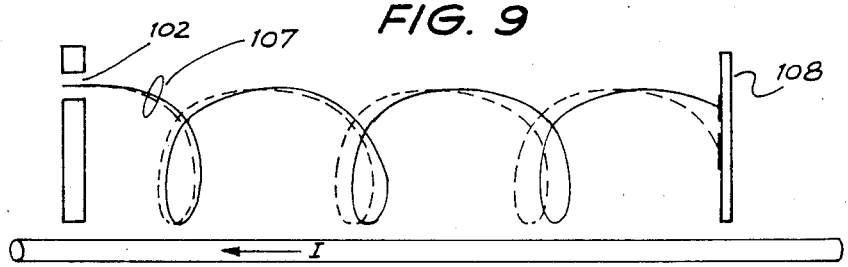
FIG. 9 schematically illustrates a variation to the embodiment of FIG. 8 for separating ions of similar mass.

As illustrated in FIG. 9, beam particles projected from the aperture 102 can be induced to follow a generally looping trajectory 107 wherein each loop in the trajectory is identical and the trajectory does not intersect the conductor 105. Different isotopes within the ion beam will follow slightly differing trajectories, which are dependent upon the respective atomic weights of the isotopes, the separation between the trajectories increasing with increased distance along the straight conductor. A target plate 108 can then be placed perpendicularly to the conductor 105 in an optimized position such that different isotopes form different concentric circular deposits on the target plate.

In another application of the apparatus of FIG. 8, the ion beam source 101 can be replaced by an electron beam source, such that an annular beam of electrons is focussed onto a short portion of the straight conductor 105 thereby causing the conductor to radiate x-rays along the portion upon which the electron beam is focussed. This simple x-ray source has radial symmetry, making it suitable for use in processes such as the x-ray curing of rubber in car tires, and continuous curing processes wherein the parts to be cured move in a circular path past the x-ray source.

Turning now to another application of the present invention, any charged particle which is accelerated also radiates electromagnetic energy. The acceleration or deflection of high energy particles (i.e. millions of volts) will cause such particles to radiate light, x-rays, etc.

With the strong fields available from the device of the present invention, high enery electrons may be deflected into paths which have a very short radius of curvature and thus be made to emit synchrotron radiation. This radiation was previously only derivable from a few expensive accelerators in the world. It is possible with a device operating on the principle of the present invention to reduce the price and complexity of sychrotron radiation generators by many orders of magnitude.

Known accelerators deflect high energy particles around a circular path having radii in the order of metres e.g. 2 meters. According to the present invention radii can be reduced to an order of centimetres. For a given energy, the amount of output is determined by the radius; the smaller the radius the higher the output. The large magnetic fields required to cause such rapid deflections of electron trajectories require massive currents (e.g. 1 million amps), however, these can be maintained by the use of superconductors, which have very little resistance, and which overcome previous problems of wire vaporization, or alternatively pulsed operation may be employed.

Figure 10:
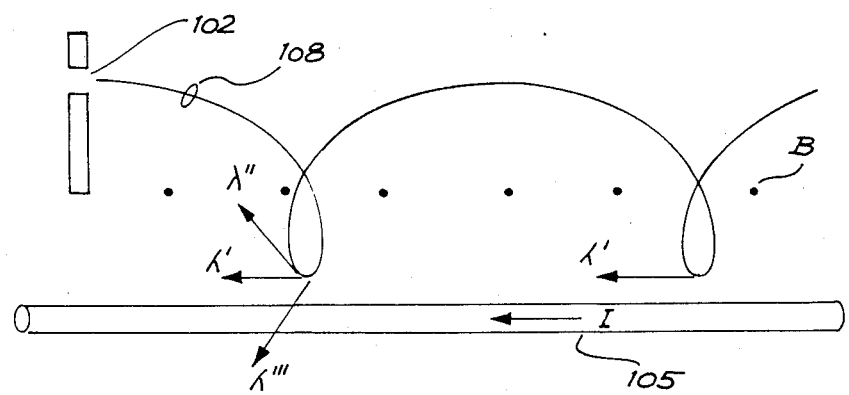
FIG. 10 schematically illustrates the use of the present invention in the generation of synchrotron radiation.

Referring now to FIG. 10, if the ion beam source is replaced by an electron beam source, the electrons in the beam 108 can be made to emit synchrotron radiation by causing the beam to follow a looping trajectory. It will be noted that, as the beam particles are electrons and thus negatively charged, the direction of current flow in the conductor 105 will be the same as that shown in FIG. 1-5 and opposite to that shown in FIGS. 8 and 9, in order to produce the required looping trajectory.

Figure 11:
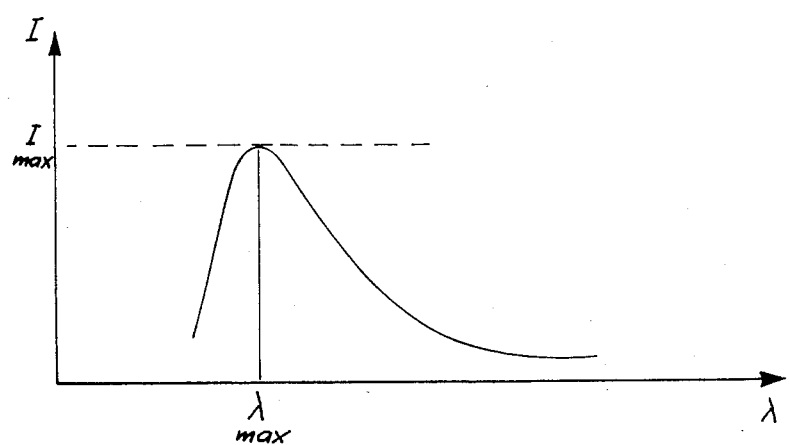
FIG. 11 graphically illustrates the spectral distribution of wavelengths produced in synchrotron radiation.

This synchrotron radiation is emitted in a direction tangential to the path of motion of the electon and the distribution of wavelengths $\lambda$ produced in the emitted ratiation at any point along the trajectory are illustrated in the curve of FIG. 11 which has its peak output $I_{max}$ located at a wavelength $\lambda_{max}$ (measured in Angstroms) given by:

$$\lambda max = (2.35 Re/E^3) \qquad (2)$$

where $R_e$ is the instantanious radius of curvature of the electron path, and E is the energy of the electron, measured in GeV. From FIG. 10 it will be seen that radiation having various different values of $\lambda_{max}$ ($\lambda'$, $\lambda''$ & $\lambda'''$) is produced as the electron travels along its looping trajectory, the minimum value $\lambda'$ being produced at the point closest to the conductor, where the radiation is emitted in a direction parallel to the conductor. Synchrotron radiation has an advantage over conventional radiation sources, in that the wavelength can be continuously varied by adjusting the parameters of the focussing system, and the output level is substantially independent of the centre wavelength, $\lambda_{max}$, unlike sources such as gas discharge tubes and other conventional light sources where the output has peaks at particular wavelengths which are dependent upon the characteristics of the elements being excited to produce the radiation.

Use may be made of a synchrotron radiation generator, of the type described with reference to FIG. 10, to produce a Free Electron Laser wherein mirrors are used to form a resonant cavity, and the synchrotron radiation is generated within this cavity. The system can also be used to produce an x-ray laser.

Figure 12:
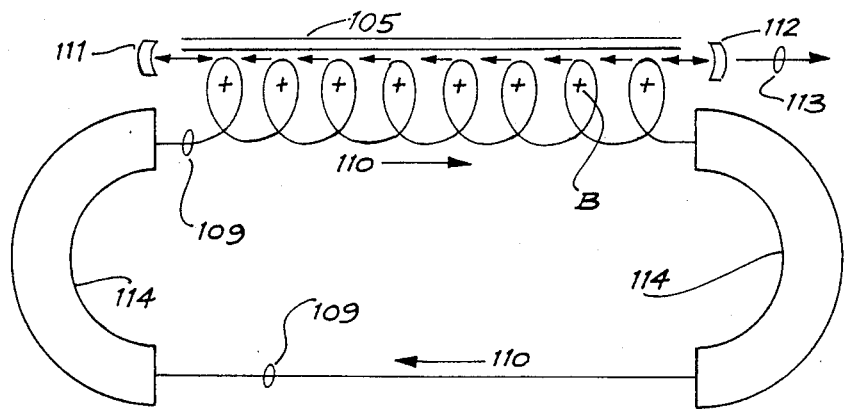
FIG. 12 schematically illustrates the use of the present invention in a free electron laser.
Figure 13:
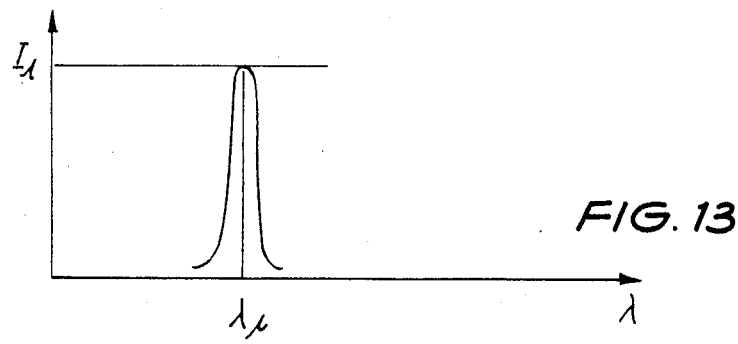
FIG. 13 graphically illustrates the spectral wavelength distribution in the output of the free electron laser of FIG. 12.

A laser of this type is schematically illustrated in FIG. 12 wherein the electron beam 109 travels generally in the direction indicated by the arrow 110 and follows a looping trajectory due to the magnetic field B produced by the current I in the conductor 105. Synchrotron radiation is produced in directions tangential to the looping trajectory and the radiation in the direction parallel to the conductor 105 will have a wavelength distribution as illustrated in FIG. 11 with $\lambda_{max}$ as given in equation (1), where $R_e$ is the radius of curvature of the trajectory at the point where the tangent is parallel to the conductor 105. The resonant cavity comprises a pair of mirrors 111 and 112 spaced such that the cavity is resonant at the frequency $\lambda_l$, one of the mirrors 111 being fully reflecting and the other 112 having a small transmission which becomes the output 113 of the laser. This output 113 has a wavelength distribution which peaks at $\lambda_l$ as seen in FIG. 13. The peak laser wavelength $\lambda_l$ will preferably coincide with the peak synchrotron radiation wavelength $\lambda_{max}$ for maxium efficiency.

The beam steering and focussing system of the present invention (ICOL system) provides a particularly simple method of making an electron beam wiggle periodically and has an advantage over prior art fixed magnet beam undulators in free electron lasers, in that the loop spacing in electron trajectories can be varied by changing the current I through the straight conductor 105, making it far easier to change wavelengths than in prior art lasers where the system of fixed magnets must be changed. The ICOL system should also be more compact than prior art systems.

Like other Free Electron Lasers, the ICOL Laser will need an energetic source of electrons from an accelerator, and for maximum power this source should provide a hollow electron beam to take full advantage of the symmetry of the magnetic field B, the resulting laser beam also being hollow under these conditions.

System efficiency will also be improved by recycling the electron beam, causing it to pass through the system many times. This is achieved by employing bending magnets 114 as illustrated in FIG. 12 which recirculate the electron beam. Suitable storage rings are already available which can keep an energetic beam of electrons circulating for hours and it is a simple matter to add such storage rings to the system as illustrated in FIG. 12.

Figure 14:
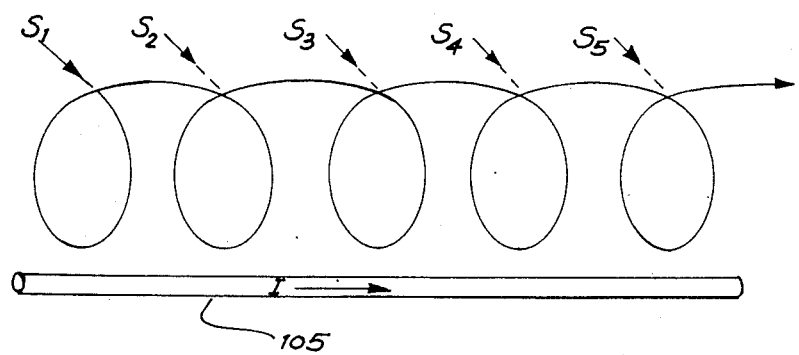
FIG. 14 schematically illustrates another form of ion beam intensifier making use of the beam focussing and steering system of the present invention.

In another application of the beam steering and focussing device of the present invention the looping effect illustrated in FIG. 5 can also be used to good effect where a number of sources are required to be combined. Referring to FIG. 14, each of a plurality of beam sources $S_1$, $S_2$ . . . $S_5$ are directed toward the straight conductor 105 such that the beam from each source approaches at a tangent to a loop of the looping trajectory. In this way a total beam current is produced which is equal to the sum of the beam currents from each of the sources $S_1$, $S_2$, . . . $S_5$.

Although the present invention has been described with reference to the drawings and to preferred embodiments, it will be appreciated that the invention is not to be limited thereby, and that suitable alternatives may be substituted for specifically described features, without departing from the spirit or scope of the invention as broadly disclosed herein.

I claim:

1. A system for steering or focussing beams such as ion or electron beams with a magnetic field the system comprising: at least one straight conducting wire carrying a large electric current; means for projecting charged particles along the conducting wire in radial spaced relation thereto; first power supply means connected to the conducting wire for supplying current in a first direction to said conducting wire, said first power supply means generating a circular magnetic field which is coaxial with the wire and which deflects charged particles projected by said charged particle projecting means; means for aligning the charged particle projecting means along a path extending in a direction substantially co-planar with and parallel to the axis of the conducting wire to define a plane including said path and the axis of the conducting wire, wherein a deflecting force is generated by the coaxial magnetic field, and exerts a force on each particle in said plane to sheer or focus said particles.

2. A system as claimed in claim 1 wherein said charged particle projecting means is coaxial with the conducting wire for generating an annular beam of charged particles, the projection of which annular beam is co-axial with the straight conducting wire.

3. A system as claimed in claim 1 wherein the charged particle projecting means is annular in shape, and the straight conducting wire passes through the center of the projecting means.

4. A system as claimed in claim 1 wherein the straight conducting wire is a super conductor.

5. A system as claimed in claim 4, wherein the super conductor is formed by a bore extending through the conducting wire and means for passing a cooling fluid through the bore is connected to the bore.

6. A system as claimed in claim 5 wherein the cooling fluid is liquid nitrogen.

7. A beam steering or focussing system as claimed in claim 1 wherein the straight conducting wire is surrounded by a hollow cylindrical conductor which is co-axial therewith to define an annular space therebetween; wherein the beam of charged particles is aligned with the space between the straight conducting wire and the hollow cylindrical conductor and passes between the straight conducting wire and the cylindrical conductor.

8. A system as claimed in claim 7 wherein said hollow cylindrical conductor is connected to a second power supply means and has a current direction opposite the first current direction of the straight conducting wire whereby said cylindrical conductor conducts a current in a direction opposite to the direction of the current carried in the staight conducting wire.

9. A beam steering or focussing system as claimed in claim 7 wherein the second power supply means includes means for producing a static electric field between the straight conducting wire and the cylindrical conductor to enhance focussing of said charged particles.

10. A system as claimed in claim 1, wherein a plurality of straight conducting wires are laterally aligned with a common axis, with means being provided for independently controlling the current in each of the plurality of wires.

11. A system as claimed in claim 1 wherein the charged particle projecting means includes means for projecting charged particles of different mass or electrical charge, wherein particles of the same mass and charge of said particles of different mass or electrical charge are focussed by converging the beam of particles at the same point along the axis of said straight conducting wire to define a resultant plurality of focus points along the wire, each focus point corresponding to a different mass and charge combination.

12. A system as claimed in claim 11 wherein a portion of the straight conducting wire is defined as a target portion and said first power supply means includes means for adjusting the current in the wire to further enhance for focussing said particles onto the target portion of the wire by converging said beam of particles.

13. A system as claimed in claim 7 including means for adjusting the current in the straight conducting wire for generating a magnetic field about the wire which is sufficiently strong to cause charged particles projected by the charged particle projecting means to follow a looping path along with wire without striking said wire.

14. A system as claimed in claim 13 further including a plate oriented normally with respect to the axis of the conducting wire wherein the charged particle projecting means directs a beam therefrom onto the plate such that particles of differing mass or electrical charge will be deposited on said plate in circular deposits of differing radius.

15. A system as claimed in claim 14 wherein said straight conducting wire passes through an opening in the center of the plate.

16. A system as claimed in claim 1 including means for adjusting the current in the straight conducting wire is for generating a magnetic field about the wire which focusses charged particles projected by said charged particle projecting means at a focal point beyond the end of the straight conducting wire.

17. A system as claimed in claim 16 further including a target containing a material selected from the group consisting of Deuterium and Tritium positioned at said focal point.

18. A system as claimed in claim 17 wherein the charged particle projecting means is a Deuterium ion projecting means, and wherein said includes means system for focussing projected Deuterium ions onto said target.

19. A system as claimed in claim 17 wherein the charged particle projecting means is a Tritium ion projecting means, and wherein said includes means system for focussing projected Tritium ions onto said target.

20. A system as claimed in claim 1 wherein the charged particle projecting means is an electron beam projecting means, and wherein the system includes means for adjusting the current in the straight conducting wire for generating a magnetic field which focusses the electron beam at a point along the straight conducting wire by converging the beam; the electron beam projecting means including means for projecting an electron beam of sufficient energy which upon collision with said straight conducting wire will provide a source of x-ray radiation from said wire.

21. A system as claimed in claim 20 wherein the conducting wire is of sufficiently narrow cross section in the region where the electron beam is to be focussed to provide a thin source of x-ray radiation after convergingly focussing the electron beam thereupon.

22. A synchrotron radiation generator comprising system as claimed in claim 7 for steering or focussing a beam wherein the charged particle projecting means is an electron beam projecting means and means for adjusting the current in the straight conducting wire generates a magnetic field about the straight conducting wire which is sufficiently strong to cause the electrons in said beam to follow a looping path along the wire without striking the wire, with a minimum radius of the looping path and the electron beam energy being sufficient to emit synchrotron radiation.

23. A synchrotron radiation generator as claimed in claim 22 wherein bending magnets are used to recirculate the electron beam.

24. A system for focussing an electron beam with a magnetic field to impinge the electron beam on a straight conducting wire at a point thereon to provide a source of x-ray radiation from the straight conducting wire, the system comprising: electron beam projecting means for projecting the electron beam along the conducting wire in radial spaced relation thereto with sufficient energy to provide a source of x-ray radiation from said straight conducting wire after said electrons colide with said conducting wire; power supply means connected to the straight conducting wire for supplying current in one direction to the conducting wire, the power supply means including means for adjusting the current in the straight conducting wire for generating a magnetic field which focuses the electron beam on said point, the power supply means generating a circular magnetic field which is coaxial with the wire and which deflects electrons projected in said electron beam; means for aligning the output of the electron beam projecting means along a path extending in a direction substantially co-planar with and parallel to the axis of the conducting wire to define a plane including said path and the axis on the conducting wire, wherein a deflecting force is generated by the coaxial magnetic field, and exerts a force on each electron in the beam in said plane defined by said axis to focus and steer said beam.

25. A system for focussing ion beams with a magnetic field to impinge the ion beam on a target material to implant the ions in the target material, the system comprising: at least one straight conducting wire for carrying a large electric current; ion projecting means for porjecting ions along the conducting wire in radial spaced relation thereto; power supply means connected to the conducting wire for supplying current in one direction to said the conducting wire, the power supply means generating a circular magnetic field which is coaxial with the wire and which deflects ions projected by said ion projecting means; means for aligning the ion projecting means along a path extending in a direction substantially co-planar with and parallel to the axis of the conducting wire to define a plane including the path and the axis on the conducting wire, wherein a deflecting force is generated by the coaxial magnetic field, and exerts a force on each ion in said plane.

* * * * *